(12) United States Patent
Li et al.

(10) Patent No.: US 12,178,087 B2
(45) Date of Patent: Dec. 24, 2024

(54) ORGANIC LIGHT-EMITTING DIODE DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Kaikai Li, Guangdong (CN); Jia Tang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,193

(22) PCT Filed: Dec. 21, 2021

(86) PCT No.: PCT/CN2021/140166
§ 371 (c)(1),
(2) Date: Dec. 27, 2021

(87) PCT Pub. No.: WO2023/108728
PCT Pub. Date: Jun. 22, 2023

(65) Prior Publication Data
US 2024/0049522 A1 Feb. 8, 2024

(30) Foreign Application Priority Data

Dec. 16, 2021 (CN) .......................... 202111544842.X (51) Int. Cl.
*H10K 59/124* (2023.01)
*H10K 59/121* (2023.01)
(Continued)

(52) U.S. Cl.
CPC ....... *H10K 59/124* (2023.02); *H10K 59/1213* (2023.02); *H10K 59/122* (2023.02); *H10K 59/126* (2023.02); *H10K 59/131* (2023.02)

(58) Field of Classification Search
CPC .. H10K 29/124; H10K 59/131; H10K 59/122; H10K 59/1213; H10K 59/126
See application file for complete search history.

(56) References Cited

U.S. PATENT DOCUMENTS

| 2018/0097047 | A1* | 4/2018 | Jung | H10K 59/123 |
| 2018/0123078 | A1* | 5/2018 | Byun | H10K 50/81 |
| 2021/0210571 | A1* | 7/2021 | Zhang | H10K 50/824 |

* cited by examiner

*Primary Examiner* — Christine A Enad
(74) *Attorney, Agent, or Firm* — PV IP PC; Wei Te Chung (57) ABSTRACT

An organic light-emitting diode (OLED) display panel and a display device are provided. The OLED display panel includes a substrate, a thin-film transistor device layer, a light-emitting device, a passivation layer, a planarization layer, a level-raised layer, a protruding platform, an auxiliary electrode, and an undercut channel. The protruding platform is disposed directly above the level-raised layer. The auxiliary electrode includes a contact portion and a step portion, and the step portion is located at a vertical level higher than a vertical level of the contact portion. An orthographic projection of the undercut channel on the substrate and an orthographic projection of the level-raised layer on the substrate are spaced apart from each other.

20 Claims, 4 Drawing Sheets

(51) Int. Cl.
*H10K 59/122* (2023.01)
*H10K 59/126* (2023.01)
*H10K 59/131* (2023.01)

ORGANIC LIGHT-EMITTING DIODE DISPLAY PANEL AND DISPLAY DEVICE

BACKGROUND OF INVENTION

1. Field of Invention

The present application relates to a technical field of displays, and particularly to an organic light-emitting diode display panel and a display device.

2. Related Art

With development of display technology, display techniques are ever-changing. Organic light-emitting diodes (OLEDs) are acclaimed as a rising star of display technology due to advantages of thin thickness, being self-luminous, rich colors, and being bendable.

When OLED panels are working, a display center and the outside of the center, and surrounding edges will have the problem of voltage degradation (IR drop, that is, the voltage drop causes the final brightness unevenness). It is necessary to provide auxiliary electrodes for giving additional assistance to areas with larger voltage drops, so that entire panels can be displayed with same quality of even brightness. At present, a main solution for preparing auxiliary electrodes is to make undercut structures on backplanes, so that cathodes are overlapped with auxiliary sources, thereby achieving the function of the auxiliary electrodes. Traditional undercut structures use newly added pad layers as support layers, but the newly added pad layers not only increase the cost, but is also not conducive to shortening process time. Specifically, traditional undercut structures use hydrogen fluoride to etch passivation layers under support layers. Density of an interface between undercut support layers formed through wet side etching with support layers and the passivation layers will have a serious impact on the depth and shape of undercuts. In addition, if the planarization layers are used as the support layers, since the planarization layers are made of organic materials, their hardness is not as good as that of inorganic materials. Besides, interface adhesion with the passivation layers is also not good. When hydrogen fluoride etches a passivation layer, a side etching rate is very fast, causing the etching on a top side of the passivation layer at the interface to be too fast, while the etching on a bottom side etching is slow. In the end, an actual depth of an undercut is insufficient, taper angles of etching sides of the passivation layer is slow, or poor support effects of a planarization layer occurred as depth requirements are fulfilled, causing the risk of collapse in follow-up processes.

SUMMARY OF INVENTION

An object of present application is to provide an organic light-emitting diode display panel and a display device to solve the problems that actual depth of traditional undercut structures are insufficient and inclination angles of etching sides of passivation layers are slow, or poor support effects of planarization layers occurred as depth requirements are fulfilled, causing the risk of collapse in follow-up processes.

To achieve the above-mentioned object, the present application provides a technical solution as follows:

An embodiment of the application provides an organic light-emitting diode display panel including a substrate; a thin-film transistor device layer disposed on the substrate, and comprising a functional film layer and a thin-film transistor; a light-emitting device disposed on the thin-film transistor device layer; a passivation layer disposed on the thin-film transistor device layer; a planarization layer disposed on the passivation layer; the functional film layer comprising a level-raised layer and a protruding platform. The protruding platform is disposed directly above the level-raised layer and comprises a first top surface and a first side wall located on one side of the first top surface; an auxiliary electrode disposed between the light-emitting device and the substrate and comprising a contact portion and a step portion, the step portion located on the first top surface, and the contact portion located adjacent to the first side wall. The step portion is located at a vertical level higher than a vertical level of the contact portion; and an undercut channel arranged on the contact portion of the auxiliary electrode, and a first through hole passing through the planarization layer and located above the undercut channel, wherein an orthographic projection of the undercut channel on the substrate and an orthographic projection of the level-raised layer on the substrate are spaced apart from each other.

Optionally, the planarization layer comprises a first support portion including a groove, the passivation layer comprises a second support portion located in the groove, wherein the first support portion and the second support portion are disposed on the step portion of the auxiliary electrode, respectively, and part of the first support portion and part of the second support portion extend out of the first side wall and are suspended above the undercut channel.

Optionally, an orthographic projection of a bottom surface of the first support portion close to the undercut channel is completely located on the undercut channel.

Optionally, the thin-film transistor device layer further comprises a light-shielding layer arranged under the thin-film transistor, and the level-raised layer and the light-shielding layer are disposed in a same layer.

Optionally, the functional film layer further comprises a buffer layer and an interlayer dielectric layer disposed on the buffer layer, and the protruding platform comprises a first protruding platform and a second protruding platform, wherein the first protruding platform is disposed on the buffer layer and is located directly above the level-raised layer, the second protruding platform is disposed on the interlayer dielectric layer, and the step portion of the auxiliary electrode is located on the second protruding platform, so that the level-raised layer, the first protruding platform, the second protruding platform, and the step portion are aligned with each other.

Optionally, the thin-film transistor comprises an active layer, a gate insulating layer, a gate, a source, and a drain, wherein the auxiliary electrode and the source and drain are disposed in a same layer.

Optionally, the level-raised layer comprises a first film layer and a second film layer stacked on the first film layer, the first film layer is part of a pattern of the gate insulating layer, and the second film layer is part of a pattern of the gate.

Optionally, the functional film layer further comprises a buffer layer and an interlayer dielectric layer disposed on the buffer layer, the protruding platform is disposed on the interlayer dielectric layer and is located directly above the level-raised layer, and the level-raised layer is disposed on the buffer layer.

Optionally, the light-emitting device comprises an anode, an organic light-emitting layer, and a cathode arranged in sequence, wherein the organic light-emitting layer and the cathode are in contact with the auxiliary electrode through the first through hole and the undercut channel, and an orthographic projection of the organic light-emitting layer on the cathode is located within a boundary of the cathode in the undercut channel.

An embodiment of the present application further provides a display device, including the organic light-emitting diode display panel described in the foregoing embodiment.

The present application has advantageous effects as follows: the embodiments of the present application provide the organic light-emitting diode display panel and the display device. By the increase in the topography of the film layers located above the level-raised layer through the disposition of the level-raised layer, the problem of side etching at an etching interface between the passivation layer and the planarization layer can be solved, and shape stability of the planarization layer is improved, and a taper angle of the passivation layer is further corrected due to the influence of the topography. In this fashion, the actual depth of the planarization layer in the undercut structure meets requirements for supportability, the mass production reliability of the planarization layer as an undercut support layer can be improved, and the number of photomasks used in manufacturing processes can be reduced. Therefore, the organic light-emitting diode display panel and display device of the present application effectively solve the problems that actual depth of traditional undercut structures are insufficient, taper angles of etching sides of passivation layers are slow, poor support effects of traditional undercut structures occurred as depth requirements are fulfilled, and the risk of collapse in follow-up processes.

BRIEF DESCRIPTION OF DRAWINGS

In order to better illustrate the technical solutions in the embodiments or in the prior art, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present application. Directional terms described by the present application, such as upper, lower, front, back, left, right, inner, outer, side, etc., are only directions by referring to the accompanying drawings, and thus the used directional terms are used to describe and understand the present invention, but the present application is not limited thereto. In the drawings, units with similar structures are indicated by the same reference numerals. In the drawings, for clear understanding and ease of description, the thickness of some layers and regions are exaggerated. That is, the size and thickness of each component shown in the drawings are arbitrarily shown, but the application is not limited to this.

The embodiments of the present application provide an organic light-emitting diode (OLED) display panel and a display device, which can overcome problems that traditional undercut structures have poor support effects and tend to pose a risk of collapse. Detailed descriptions are given below. It should be noted that the description order of the following embodiments is not intended to limit the preferred order of the embodiments.

Figure 1:
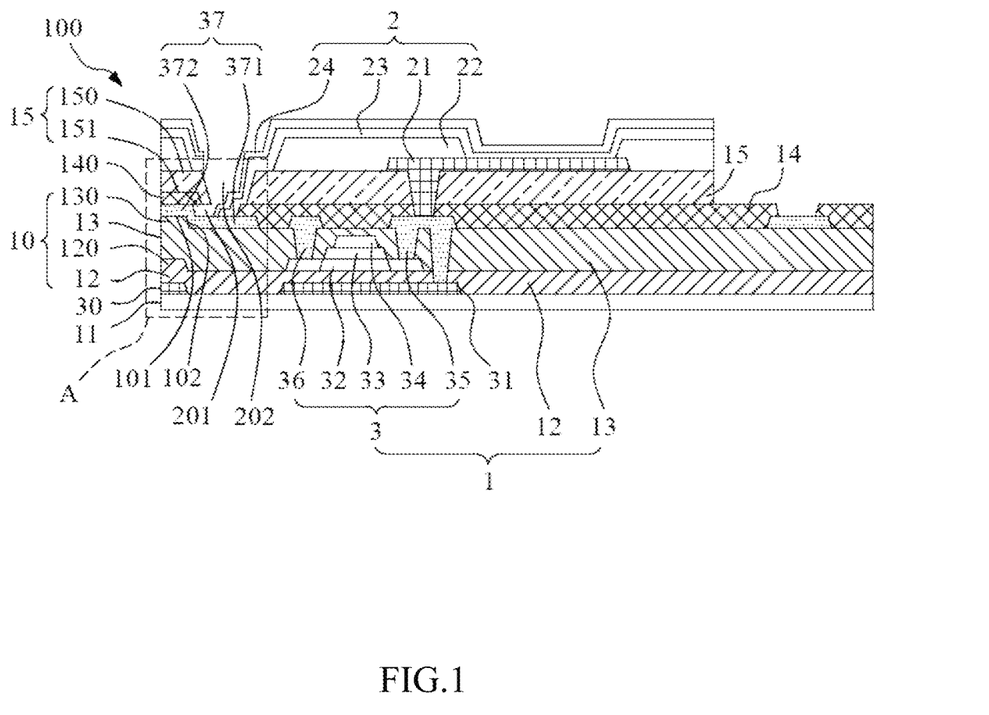
FIG. 1 is a schematic cross-sectional view of an organic light-emitting diode (OLED) display panel according to an embodiment of the present application.

Please refer to FIG. 1, which is a schematic cross-sectional view of an organic light-emitting diode (OLED) display panel 100 according to an embodiment of the present application. As shown in FIG. 1, the organic light-emitting diode display panel 100 of the present application includes a substrate 11 and a thin-film transistor device layer 1 and a light-emitting device 2 both disposed on the substrate 11, wherein the thin-film transistor device layer 1 includes a functional film layer and a thin-film transistor 3.

In this embodiment, the substrate 11 may be made of hard materials such as glass, or may be made of flexible materials such as polyimide. As shown in FIG. 1, the functional film layer of the OLED display panel 100 includes a buffer layer 12 disposed on the substrate 11 and an interlayer dielectric layer 13 disposed on the buffer layer 12. The buffer layer 12 can be made of silicon oxide or silicon nitride. A passivation layer 14 is disposed on the interlayer dielectric layer 13. A material of the passivation layer 14 may be an inorganic insulating film of silicon oxide or silicon nitride, and covers a side of the thin-film transistor 3 away from the substrate 11. A planarization layer 15 is disposed on the passivation layer 14. Specifically, a material of the planarization layer 15 may be an organic photoresist, such as soluble polytetrafluoroethylene (PFA) or polyimide glue, but the application is not limited thereto. The light-emitting device 2 is provided on a side of the planarization layer 15 away from the passivation layer 14.

Referring to FIG. 1, the light-emitting device 2 includes an anode 21, a pixel definition layer 22, an organic light-emitting layer 23, and a cathode 24 arranged in sequence. The pixel definition layer 22 is provided with a plurality of holes, and the anode 21, the organic light-emitting layer 23, and the cathode 24 are directly stacked in the recessed holes. In this embodiment, the organic light-emitting layer 23 and the cathode 24 are arranged along the surface of the pixel definition layer 22.

As shown in FIG. 1, the thin-film transistor device layer 1 includes a light-shielding layer 31 disposed on the substrate 11, an active layer 32 disposed on the buffer layer 12, a gate insulating layer 33 disposed on the active layer 32, a gate 34 disposed on the gate insulating layer 33, and a source 35 and a drain 36 disposed on the interlayer dielectric layer 13. The source 35 and the drain 36 are electrically connected to the active layer 32 through via holes formed on the interlayer dielectric layer 13, the source 35 is electrically connected to the light-shielding layer 31 through a via hole extending along the interlayer dielectric layer 13 and the buffer layer 12, and the interlayer dielectric layer 13 covers the active layer 32, the gate insulating layer 33, and the gate 34. Specifically, the active layer 32, the gate insulating layer 33, the gate 34, the source 35, and the drain 36 together constitute the thin-film transistor 3. The gate 34 is defined as a first metal layer, the source 35 and the drain 36 are defined as a second metal layer, and the light-shielding layer 31 is located between the substrate 11 and the buffer layer 12. It should be noted that the thin-film transistors of the present application are illustrated as top-gate thin-film transistors, but bottom-gate thin-film transistors can also be used. In addition, the thin-film transistor of the present application may be a low temperature polysilicon thin-film transistor or an oxide semiconductor thin-film transistor, and types of the thin-film transistors are not limited in this application.

Figure 2:
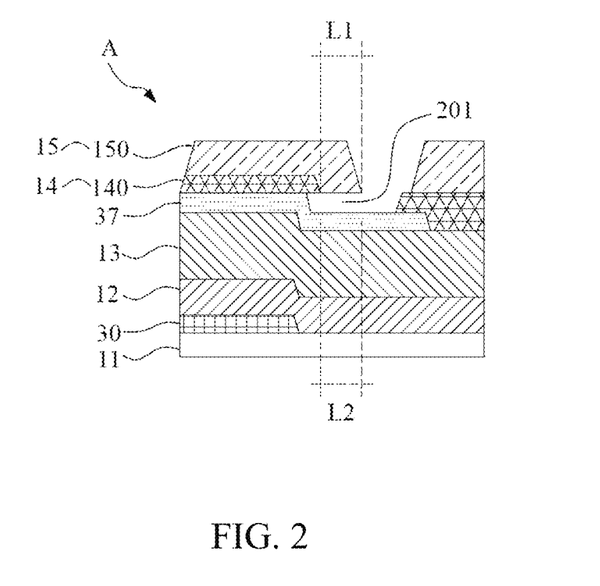
FIG. 2 is a schematic structural view of an undercut channel according to an embodiment of the application.

In particular, the OLED display panel 100 of the embodiment of the present application is provided with a structure including an undercut and an auxiliary electrode to overcome the problem of IR drop on peripheries or other positions of the display panel. Please refer to FIG. 1 in combination with FIG. 2. FIG. 2 is a schematic structural view of an undercut channel according to an embodiment of the application, wherein FIG. 2 is mainly used to illustrate the undercut channel, so the organic light-emitting layer and the cathode are not shown. As shown in FIG. 1, the functional film layer of the present application further includes a level-raised layer 30 and a protruding platform 10. In this embodiment, the level-raised layer 30 and the light-shielding layer 31 are disposed in the same layer. Specifically, the level-raised layer 30 is part of the light-shielding layer 31 that is patterned by a photolithography process, that is, the level-raised layer 30 and the light-shielding layer 31 are formed by the same photolithography process. Since the arrangement of the level-raised layer 30 increases a topography of other film layers located above, the topography of the buffer layer 12 on the level-raised layer 30 correspondingly rises, thereby forming the first protruding platform 120. The topography of the interlayer dielectric layer 13 on the buffer layer 12 correspondingly rises, so that the second protruding platform 130 is formed. That is, the protruding platform 10 including the first protruding platform 120 and the second protruding platform 130 are formed directly above the level-raised 30. Specifically, the protruding platform 10 includes a first top surface 101 and a first side wall 102 located on one side of the first top surface 101. In this embodiment, the first top surface 101 and the first side wall 102 are formed on the second protruding platform 130. In other words, in a process of preparing the buffer layer 12, the first protruding platform 120 may be formed at the same time; in a process of preparing the interlayer dielectric layer 13, the second protruding platform 130 may be formed at the same time.

Please continue referring to FIG. 1. The organic OLED display panel 100 of the present application includes the auxiliary electrode 37 disposed between the light-emitting device 2 and the substrate 11, and includes a contact portion 371 and a step portion 372. The step portion 372 is located on the first top surface 101, that is, on the second protruding platform 130. The contact portion 371 is located adjacent to the first side wall 102. Due to the arrangement of the second protruding platform 130, the topography of the step portion 372 rises, so that the step portion 372 is located at a vertical level higher than a vertical level of the contact portion 371. Specifically, the level-raised layer 30, the first protruding platform 120, the second protruding platform 130, and the step portion 372 are aligned with each other in a longitudinal axial direction. In this embodiment, the auxiliary electrode 37 is disposed in the same layer as the source 35 and the drain 36. That is, the auxiliary electrode 37, the source 35 and the drain 36 are formed from the second metal layer through a same photolithography process.

As shown in FIG. 1, the undercut channel 201 is located on the contact portion 371 of the auxiliary electrode 37, and a first through hole 202 passes through the planarization layer 15 above the undercut channel 201. In this embodiment, the undercut channel 201 is formed by etching the passivation layer 14 on the auxiliary electrode 37 by hydrogen fluoride. Specifically, an orthographic projection of the undercut channel 201 on the substrate 11 and an orthographic projection of the level-raised layer 30 on the substrate 11 are spaced apart from each other.

Please continue to refer to FIG. 1. The planarization layer 15 includes a first support portion 150 which includes a groove 151. The passivation layer 14 includes a second support portion 140, which is located in and covered by the groove 151. As the level-raised layer 30 increases the topography, the first support portion 150 and the second support portion 140 are disposed on the step portion 372 of the auxiliary electrode 37, respectively. In addition, part of the first support portion 150 and part of the second support portion 140 extend out of the first side wall 102 and are suspended above the undercut channel 201 (as shown in FIG. 2).

Figure 3:
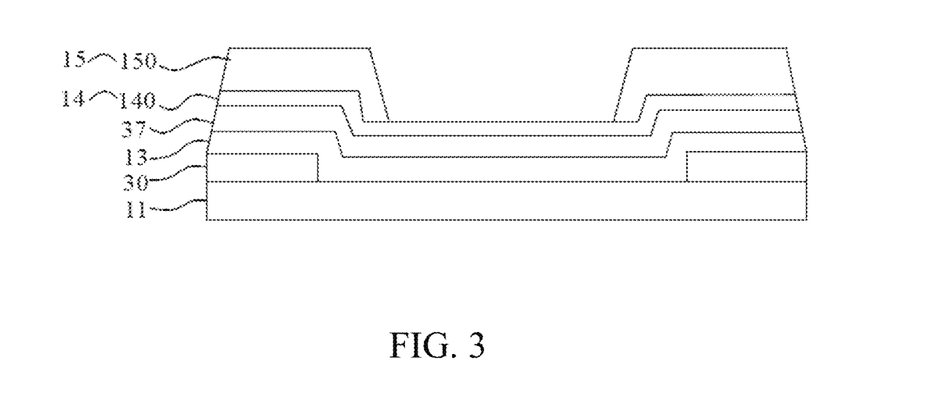
FIG. 3 is a schematic structural view showing the raise in height in a level-raised layer and film layers above the level-raised layer according to an embodiment of the application.
Figure 4:
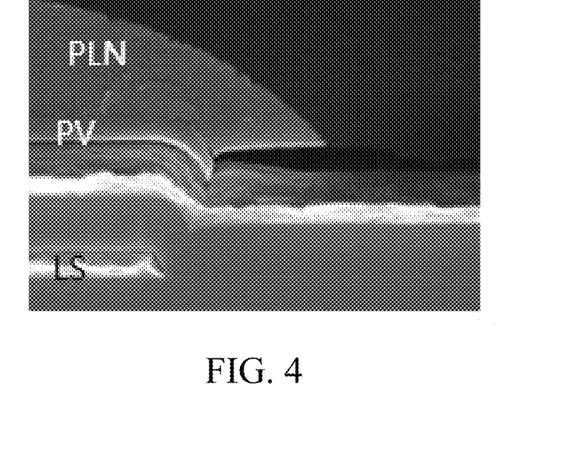
FIG. 4 is a schematic view of optical simulation of a passivation layer and a planarization layer in the undercut channel according to an embodiment of the application.

Please refer to FIG. 1 in combination with FIGS. 2 to 4. FIG. 3 is a schematic structural view showing the raise in height in the level-raised layer and film layers above the level-raised layer according to an embodiment of the application, wherein FIG. 3 does not show the buffer layer 12 in order to illustrate a relationship between the level-raised layer 30 and the undercut channel 201. FIG. 4 is a schematic view of optical simulation of the passivation layer and the planarization layer in the undercut channel according to an embodiment of the application. As shown in FIGS. 1 and 2, one end of the undercut channel 201 communicates with the first through hole 202 above, and the other end is closed at the step portion 372 of the auxiliary electrode 37. Through the structure of the undercut channel 201, an orthographic projection of a bottom surface of the first support 150 close to the undercut channel 201 is completely located on the undercut channel 201. In other words, as etching time increases, a side etching length L1 on a top of the passivation layer 14 is affected by the topography and is blocked by the step portion 372 of the auxiliary electrode 37, so that an increase in the side etching length L1 is limited, a depth of an undercut length L2 at a bottom of the passivation layer 14 increases and gradually approaches the side etching length L1. Finally, a taper angle of the passivation layer 14 is corrected to be more than 30°. Specifically, an actual depth of the undercut channel 201 (that is, L2) reaches 1 micron (as shown in FIG. 2), and the stability of the undercut shape (that is, suspended part) of the planarization layer 15 is improved (as shown in FIG. 4).

Further referring to FIG. 1, the organic light-emitting layer 23 and the cathode 24 are in contact with the contact portion 371 of the auxiliary electrode 37 through the first through hole 202 and the undercut channel 201. Particularly, by controlling evaporation angles of the organic light-emitting layer 23 and the cathode 24, an orthographic projection of the organic light-emitting layer 23 on the cathode 24 is located within a boundary of the cathode 24 in the undercut channel 201. That is, the organic light-emitting layer 23 is disconnected in the undercut channel 201, so that a contact area between the cathode 24 and the auxiliary electrode 37 increases, which is further advantageous to the cathode 24 to extend along the undercut channel 201, thereby increasing the contact area between the cathode 24 and the auxiliary electrode 37, and facilitating better electrical connection, so as to reduce the voltage drop.

Figure 5:
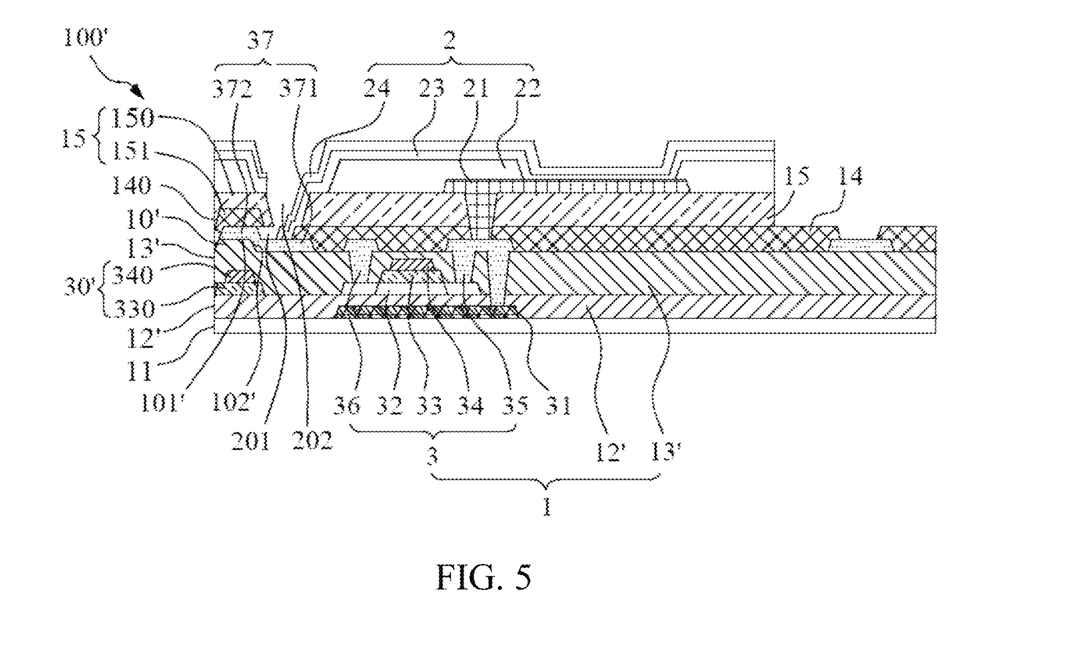
FIG. 5 is a schematic cross-sectional view of an OLED display panel according to another embodiment of the present application.

Please refer to FIG. 5, which is a schematic cross-sectional view of an organic light-emitting diode display panel according to another embodiment of the present application. The difference between the embodiment shown in FIG. 5 and the above-mentioned embodiment lies in that a position where a level-raised layer 30' is arranged. Other structures that are the same as the above-mentioned embodiment will not be repeated in this embodiment. In this embodiment, the level-raised layer 30' is disposed on a buffer layer 12', and includes a first film layer 330 and a second film layer 340 stacked on first film layer 330. The first film layer 330 is part of the gate insulating layer 33 after patterning, that is, the first film layer 330 and the gate electrode 34 are formed by a same photolithography process. In addition, the second film layer 340 is part of the gate electrode 34 after patterning, that is, the second film layer 340 and the gate electrode 34 are formed by the first metal layer through a same photolithography process. It should be noted that the second film layer 340 and the first film layer 330 can be fabricated by a same photolithography process through a self-aligned process. In this embodiment, since the level-raised layer 30' constituted by the first film layer 330 and the second film layer 340 increases the topography of upper film layers. Therefore, the topography of the interlayer dielectric layer 13' located above the level-raised layer 30' correspondingly rises, thereby forming a protruding platform 10'. That is, the protruding platform 10' of this embodiment is formed on the interlayer dielectric layer 13 and is located directly above the level-raised layer 30'. As shown in FIG. 5, the protruding platform 10' of this embodiment includes a first top surface 101' and a first side wall 102' located on one side of the first top surface 101'. In this embodiment, the level-raised layer 30' is arranged on the buffer layer 12', which can also achieve the effect of increasing a topography, thereby causing an increase in the topography of film layers located above, so that the level-raised layer 30' in this embodiment provides the same effect as the level-raised layer of the embodiment shown in FIG. 1.

Figure 6:
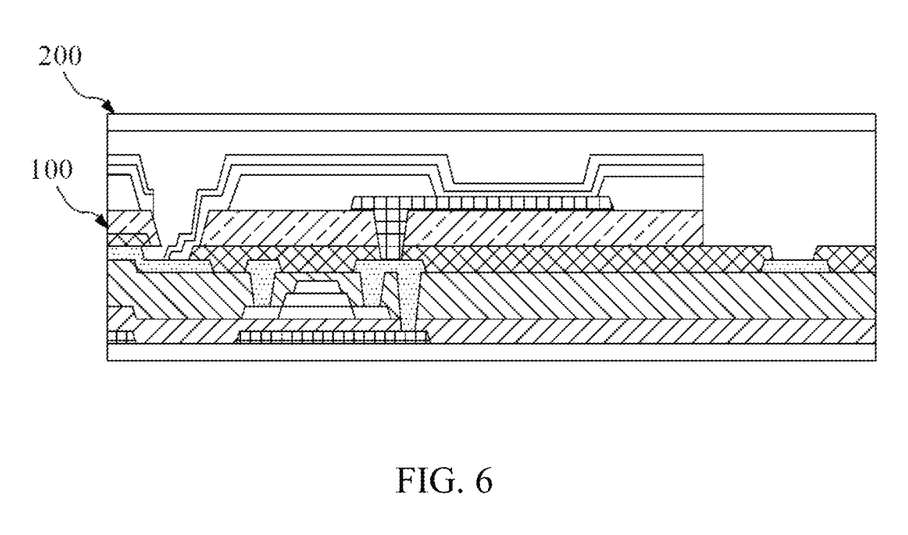
FIG. 6 is a schematic structural view of a display device according to an embodiment of the application.

Please refer to FIG. 6, which is a schematic structural view of a display device of an embodiment of the present application. An embodiment of the present application further provides a display device 200, including the organic light-emitting diode display panel 100 in any of the above embodiments. The display device 200 may be an electronic product, such as a television, a notebook computer, a tablet computer, or a mobile phone.

Accordingly, the embodiments of the present application provide the organic light-emitting diode display panel and the display device. By the increase in the topography of the film layers located above the level-raised layer through the disposition of the level-raised layer, the problem of side etching at an etching interface between the passivation layer and the planarization layer can be solved, and shape stability of the planarization layer is improved, and a taper angle of the passivation layer is further corrected due to the influence of the topography. In this fashion, the actual depth of the planarization layer in the undercut structure meets requirements for supportability, the mass production reliability of the planarization layer as an undercut support layer can be improved, and the number of photomasks used in manufacturing processes can be reduced. Therefore, the organic light-emitting diode display panel and display device of the present application effectively solve the problems that actual depth of traditional undercut structures are insufficient, taper angles of etching sides of passivation layers are slow, poor support effects of traditional undercut structures occurred as depth requirements are fulfilled, and the risk of collapse in follow-up processes.

In the above-mentioned embodiments, the description of each embodiment has its own emphasis. For parts that are not described in detail in an embodiment, reference may be made to related descriptions of other embodiments.

The above describes the embodiments of the present application in detail. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. An organic light-emitting diode display panel, comprising:
   a substrate;
   a thin-film transistor device layer disposed on the substrate, and comprising a functional film layer and a thin-film transistor;
   a light-emitting device disposed on the thin-film transistor device layer;
   a passivation layer disposed on the thin-film transistor device layer;
   a planarization layer disposed on the passivation layer;
   wherein the functional film layer comprises a level-raised layer and a protruding platform, and the protruding platform is disposed directly above the level-raised layer and comprises a first top surface and a first side wall located on one side of the first top surface;
   an auxiliary electrode disposed between the light-emitting device and the substrate and comprising a contact portion and a step portion, the step portion located on the first top surface, and the contact portion located adjacent to the first side wall, wherein the step portion is located at a vertical level higher than a vertical level of the contact portion; and
   an undercut channel arranged on the contact portion of the auxiliary electrode, and a first through hole passing through the planarization layer and located above the undercut channel, wherein an orthographic projection of the undercut channel on the substrate and an orthographic projection of the level-raised layer on the substrate are spaced apart from each other;
   wherein the planarization layer comprises a first support portion including a groove, the passivation layer comprises a second support portion located in the groove, wherein the first support portion and the second support portion are disposed on the step portion of the auxiliary electrode, respectively, and part of the first support portion and part of the second support portion extend out of the first side wall and are suspended above the undercut channel.

2. The organic light-emitting diode display panel of claim 1, wherein an orthographic projection of a bottom surface of the first support portion close to the undercut channel is completely located on the undercut channel.

3. The organic light-emitting diode display panel of claim 1, wherein the thin-film transistor device layer further comprises a light-shielding layer arranged under the thin-film transistor, and the level-raised layer and the light-shielding layer are disposed in a same layer.

4. The organic light-emitting diode display panel of claim 3, wherein the functional film layer further comprises a buffer layer and an interlayer dielectric layer disposed on the buffer layer, and the protruding platform comprises a first protruding platform and a second protruding platform, wherein the first protruding platform is disposed on the buffer layer and is located directly above the level-raised layer, the second protruding platform is disposed on the interlayer dielectric layer, and the step portion of the auxiliary electrode is located on the second protruding platform, so that the level-raised layer, the first protruding platform, the second protruding platform, and the step portion are aligned with each other.

5. The organic light-emitting diode display panel of claim 1, wherein the thin-film transistor comprises an active layer, a gate insulating layer, a gate, a source, and a drain, wherein the auxiliary electrode and the source and drain are disposed in a same layer.

6. The organic light-emitting diode display panel of claim 5, wherein the level-raised layer comprises a first film layer and a second film layer stacked on the first film layer, the first film layer is part of a pattern of the gate insulating layer, and the second film layer is part of a pattern of the gate.

7. The organic light-emitting diode display panel of claim 6, wherein the functional film layer further comprises a buffer layer and an interlayer dielectric layer disposed on the buffer layer, the protruding platform is disposed on the interlayer dielectric layer and is located directly above the level-raised layer, and the level-raised layer is disposed on the buffer layer.

8. The organic light-emitting diode display panel of claim 1, wherein the light-emitting device comprises an anode, an organic light-emitting layer, and a cathode arranged in sequence, wherein the organic light-emitting layer and the cathode are in contact with the auxiliary electrode through the first through hole and the undercut channel, and an orthographic projection of the organic light-emitting layer on the cathode is located within a boundary of the cathode in the undercut channel.

9. A display device, comprising an organic light-emitting diode display panel, wherein the organic light-emitting diode display panel comprises:
a substrate;
a thin-film transistor device layer disposed on the substrate, and comprising a functional film layer and a thin-film transistor;
a light-emitting device disposed on the thin-film transistor device layer;
a passivation layer disposed on the thin-film transistor device layer;
a planarization layer disposed on the passivation layer;
wherein the functional film layer comprises a level-raised layer and a protruding platform, and the protruding platform is disposed directly above the level-raised layer and comprises a first top surface and a first side wall located on one side of the first top surface;
an auxiliary electrode disposed between the light-emitting device and the substrate and comprising a contact portion and a step portion, the step portion located on the first top surface, and the contact portion located adjacent to the first side wall, wherein the step portion is located at a vertical level higher than a vertical level of the contact portion; and
an undercut channel arranged on the contact portion of the auxiliary electrode, and a first through hole passing through the planarization layer and located above the undercut channel, wherein an orthographic projection of the undercut channel on the substrate and an orthographic projection of the level-raised layer on the substrate are spaced apart from each other;
wherein the planarization layer comprises a first support portion including a groove, the passivation layer comprises a second support portion located in the groove, wherein the first support portion and the second support portion are disposed on the step portion of the auxiliary electrode, respectively, and part of the first support portion and part of the second support portion extend out of the first side wall and are suspended above the undercut channel.

10. The display device of claim 9, wherein an orthographic projection of a bottom surface of the first support portion close to the undercut channel is completely located on the undercut channel.

11. The display device of claim 10, wherein the thin-film transistor device layer further comprises a light-shielding layer arranged under the thin-film transistor, and the level-raised layer and the light-shielding layer are disposed in a same layer.

12. The display device of claim 11, wherein the functional film layer further comprises a buffer layer and an interlayer dielectric layer disposed on the buffer layer, and the protruding platform comprises a first protruding platform and a second protruding platform, wherein the first protruding platform is disposed on the buffer layer and is located directly above the level-raised layer, the second protruding platform is disposed on the interlayer dielectric layer, and the step portion of the auxiliary electrode is located on the second protruding platform, so that the level-raised layer, the first protruding platform, the second protruding platform, and the step portion are aligned with each other.

13. The display device of claim 9, wherein the thin-film transistor comprises an active layer, a gate insulating layer, a gate, a source, and a drain, wherein the auxiliary electrode and the source and drain are disposed in a same layer.

14. The display device of claim 13, wherein the level-raised layer comprises a first film layer and a second film layer stacked on the first film layer, the first film layer is part of a pattern of the gate insulating layer, and the second film layer is part of a pattern of the gate.

15. The display device of claim 14, wherein the functional film layer further comprises a buffer layer and an interlayer dielectric layer disposed on the buffer layer, the protruding platform is disposed on the interlayer dielectric layer and is located directly above the level-raised layer, and the level-raised layer is disposed on the buffer layer.

16. The display device of claim 9, wherein the light-emitting device comprises an anode, an organic light-emitting layer, and a cathode arranged in sequence, wherein the organic light-emitting layer and the cathode are in contact with the auxiliary electrode through the first through hole and the undercut channel, and an orthographic projection of the organic light-emitting layer on the cathode is located within a boundary of the cathode in the undercut channel.

17. An organic light-emitting diode display panel, comprising:
a substrate;
a thin-film transistor device layer disposed on the substrate, and comprising a functional film layer and a thin-film transistor;
a light-emitting device disposed on the thin-film transistor device layer;
a passivation layer disposed on the thin-film transistor device layer;
a planarization layer disposed on the passivation layer;

wherein the functional film layer comprises a level-raised layer and a protruding platform, and the protruding platform is disposed directly above the level-raised layer and comprises a first top surface and a first side wall located on one side of the first top surface;

an auxiliary electrode disposed between the light-emitting device and the substrate and comprising a contact portion and a step portion, the step portion located on the first top surface, and the contact portion located adjacent to the first side wall, wherein the step portion is located at a vertical level higher than a vertical level of the contact portion; and an undercut channel arranged on the contact portion of the auxiliary electrode, and a first through hole passing through the planarization layer and located above the undercut channel, wherein an orthographic projection of the undercut channel on the substrate and an orthographic projection of the level-raised layer on the substrate are spaced apart from each other;

wherein the thin-film transistor device layer further comprises a light-shielding layer arranged under the thin-film transistor, and the level-raised layer and the light-shielding layer are disposed in a same layer; and wherein the functional film layer further comprises a buffer layer and an interlayer dielectric layer disposed on the buffer layer, and the protruding platform comprises a first protruding platform and a second protruding platform, wherein the first protruding platform is disposed on the buffer layer and is located directly above the level-raised layer, the second protruding platform is disposed on the interlayer dielectric layer, and the step portion of the auxiliary electrode is located on the second protruding platform, so that the level-raised layer, the first protruding platform, the second protruding platform, and the step portion are aligned with each other.

18. The organic light-emitting diode display panel of claim 17, wherein the planarization layer comprises a first support portion including a groove, the passivation layer comprises a second support portion located in the groove, wherein the first support portion and the second support portion are disposed on the step portion of the auxiliary electrode, respectively, and part of the first support portion and part of the second support portion extend out of the first side wall and are suspended above the undercut channel; and wherein an orthographic projection of a bottom surface of the first support portion close to the undercut channel is completely located on the undercut channel.

19. The organic light-emitting diode display panel of claim 17, wherein the thin-film transistor comprises an active layer, a gate insulating layer, a gate, a source, and a drain, wherein the auxiliary electrode and the source and drain are disposed in a same layer.

20. The organic light-emitting diode display panel of claim 19, wherein the level-raised layer comprises a first film layer and a second film layer stacked on the first film layer, the first film layer is part of a pattern of the gate insulating layer, and the second film layer is part of a pattern of the gate.

* * * * *